(12) United States Patent
Nasreldin et al.

(10) Patent No.: US 8,762,118 B2
(45) Date of Patent: Jun. 24, 2014

(54) MODELING HYDRAULIC FRACTURES

(75) Inventors: Gaisoni Nasreldin, Bracknell (GB); Nikolaos Constantinos Koutsabeloulis, Berkshire (GB); Vincenzo De Gennaro, Pau (FR); Stephen Alexander Hope, Middlesex (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 311 days.

(21) Appl. No.: 13/275,091

(22) Filed: Oct. 17, 2011

(65) Prior Publication Data

US 2012/0232872 A1 Sep. 13, 2012

Related U.S. Application Data

(60) Provisional application No. 61/449,994, filed on Mar. 7, 2011.

(51) Int. Cl.
*G06G 7/48* (2006.01)

(52) U.S. Cl.
USPC .......................................................... 703/10

(58) Field of Classification Search
USPC ........... 703/2, 10; 175/61; 702/13; 166/308.1
See application file for complete search history.

(56) References Cited

U.S. PATENT DOCUMENTS

| | | | |
|---|---|---|---|
| 2008/0288172 A1* | 11/2008 | Stone | 702/13 |
| 2009/0319243 A1* | 12/2009 | Suarez-Rivera et al. | 703/10 |
| 2010/0155142 A1* | 6/2010 | Thambynayagam et al. | 175/61 |
| 2010/0250214 A1* | 9/2010 | Prioul et al. | 703/10 |
| 2010/0250215 A1* | 9/2010 | Kennon et al. | 703/10 |
| 2010/0256964 A1* | 10/2010 | Lee et al. | 703/10 |
| 2010/0307755 A1* | 12/2010 | Xu et al. | 166/308.1 |
| 2011/0087473 A1* | 4/2011 | Jimenez Chavez et al. | 703/2 |
| 2011/0125476 A1* | 5/2011 | Craig | 703/10 |

OTHER PUBLICATIONS

McLennan, J. et al., "Modeling Fluid Invasion and Hydraulic Fracture Propagation in Naturally Fractured Rock: A Three-Dimensional Approach", 2010, SPE Paper 127888, presented at SPE Int. Symp. on Formation Damage Control, Lafayette, Louisiana.

Abou-Sayed, A.S. et al., "Evaluation of the Influence of In-Situ Reservoir Conditions on the Geometry of Hydraulic Fractures Using a 3-D(3-Dimensional) Simulator", 1984, Part 1, Technical approach, SPE/DOE/GRI Paper 12877, presented at Unconventional Gas Recovery Symp., Pittsburgh, PA.

Abou-Sayed, A.S. et al., "Evaluation of the Influence of In-Situ Reservoir Conditions on the Geometry of Hydraulic Fractures Using a 3-D(3-Dimensional) Simulator", 1984, Part 2, Case Studies, SPE/DOE/GRI Paper 12878, presented at Unconventional Gas Recovery Symp., Pittsburgh, PA.

Settari, A. and Cleary, M.P., "Three-Dimensional Simulation of Hydraulic Fracturing, SPE, Journal of Petroleum Technology", 1984, vol. 36, No. 7.

* cited by examiner

*Primary Examiner* — Kandasamy Thangavelu

(57) ABSTRACT

A method for modeling hydraulic fractures of a well. The method includes receiving a reservoir model that describes petrophysical properties of a subsurface of the earth near a reservoir. The method then receives one or more mechanical properties of the reservoir and generating a geomechanical model of the reservoir based on the reservoir model and the mechanical properties. After generating the geomechanical model of the reservoir, the method generates a three dimensional (3D) representation of the hydraulic fractures based on the geomechanical model and the reservoir model.

21 Claims, 7 Drawing Sheets

MODELING HYDRAULIC FRACTURES

CROSS-REFERENCE TO RELATED APPLICATIONS

This application claims benefit of U.S. provisional patent application Ser. No. 61/449,994, filed Mar. 7, 2011, which is incorporated herein by reference.

BACKGROUND

1. Field of the Invention

Implementations of various technologies described herein generally relate to geomechanical and petrophysical data processing.

2. Discussion of the Related Art

This section is intended to provide background information to facilitate a better understanding of various technologies described herein. As the section's title implies, this is a discussion of related art. That such art is related in no way implies that it is prior art. The related art may or may not be prior art. It should therefore be understood that the statements in this section are to be read in this light, and not as admissions of prior art.

Hydraulic fracturing generally includes the process of pumping fracturing fluid into a wellbore with hydraulic pumps to create enough downhole pressure to crack or fracture a formation in the subsurface of the earth. The fracturing allows proppants to be injected into the formation, thereby creating a plane of high-permeability sand through which fluids, such as hydrocarbons, can flow. After the hydraulic pressure is removed, the proppants remain in place, prop open the fracture and enhance the flow of the fluids into the wellbore.

In order to generate production forecasts of a reservoir or wellbore that uses fracturing, hydraulic fracture simulations are used to determine permeability properties of the reservoir or the wellbore. In spite of the investment by the research and industrial communities in developing various generations of hydraulic fracture simulators, these hydraulic fracturing simulators are still limited in that they fail to effectively account for variations in geomechanical and petrophysical properties of the earth.

SUMMARY

Described herein are implementations of various techniques for modeling hydraulic fractures of a well. In one implementation, a method for modeling hydraulic fractures of a well may include receiving a reservoir model that describes petrophysical properties of a subsurface of the earth near a reservoir. The method may then include receiving one or more mechanical properties of the reservoir and generating a geomechanical model of the reservoir based on the reservoir model and the mechanical properties. After generating the geomechanical model of the reservoir, the method may then include generating a three dimensional (3D) representation of the hydraulic fractures based on the geomechanical model and the reservoir model.

The above referenced summary section is provided to introduce a selection of concepts in a simplified form that are further described below in the detailed description section. The summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

Implementations of various technologies will hereafter be described with reference to the accompanying drawings. It should be understood, however, that the accompanying drawings illustrate only the various implementations described herein and are not meant to limit the scope of various technologies described herein.

DETAILED DESCRIPTION

The discussion below is directed to certain specific implementations. It is to be understood that the discussion below is only for the purpose of enabling a person with ordinary skill in the art to make and use any subject matter defined now or later by the patent "claims" found in any issued patent herein.

This patent application generally describes one or more implementations of various techniques directed to modeling hydraulic fractures of a well. Prior to describing the various techniques in detail, a brief executive summary of the claimed invention is provided in the following paragraphs.

In one implementation, a method for modeling hydraulic fractures of a well may be performed by a computer application. Initially, the computer application may receive a reservoir model and geomechanical properties of the reservoir. The computer application may then build a geomechanical model of the reservoir based on the received reservoir model and the geomechanical properties of the reservoir. The computer application may then use the geomechanical model of the reservoir to simulate hydraulic fractures of a well. The simulated hydraulic fractures indicate the fracture geometry and the permeability profile along a planar fracture in the well. The computer application may then map the simulated hydraulic fractures onto the reservoir model in order to generate a 3D representation of the hydraulic fractures of a stimulated well. The 3D representation of the hydraulic fractures may then be used to update the permeability properties of the reservoir model and to determine production forecasts for the well based on the updated permeability properties.

In this manner, the computer application may model the hydraulic fracture-reservoir interaction, evaluate hydraulic fracture containment and conductivity of a well, evaluate the influence of stress changes on hydraulic fracture geometry and investigate the complex interaction between pre-existing geological features and hydraulically induced fractures.

One or more implementations of various techniques for simulating a hydraulic fracture of a well will now be described in more detail with reference to FIGS. 1.1-6 in the following paragraphs.

Introduction to Oilfield Environment

Figure 1:
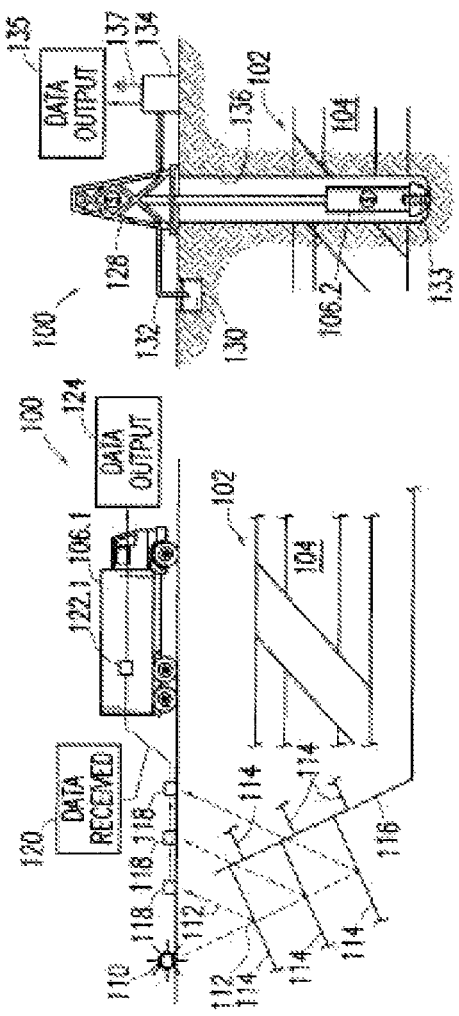
FIGS. 1.1-1.4 illustrate simplified, schematic views of an oilfield having subterranean formations containing reservoirs therein in accordance with implementations of various technologies and techniques described herein.

FIGS. 1.1-1.4 illustrate simplified, schematic views of oilfield 100 having subterranean formation 102 containing reservoir 104 therein in accordance with implementations of various technologies and techniques described herein. FIG. 1.1 illustrates a survey operation being performed by a survey tool, such as seismic truck 106.1, to measure properties of the subterranean formation. The survey operation is a seismic survey operation for producing sound vibrations. In FIG. 1.1, one such sound vibration, e.g., sound vibration 112 generated by source 110, reflects off horizons 114 in earth formation 116. A set of sound vibrations is received by sensors, such as geophone-receivers 118, situated on the earth's surface. The data received 120 is provided as input data to a computer 122.1 of a seismic truck 106.1, and responsive to the input data, computer 122.1 generates seismic data output 124. This seismic data output may be stored, transmitted or further processed as desired, for example, by data reduction.

FIG. 1.2 illustrates a drilling operation being performed by drilling tools 106.2 suspended by rig 128 and advanced into subterranean formations 102 to form wellbore 136. Mud pit 130 is used to draw drilling mud into the drilling tools via flow line 132 for circulating drilling mud down through the drilling tools, then up wellbore 136 and back to the surface. The drilling mud is usually filtered and returned to the mud pit. A circulating system may be used for storing, controlling, or filtering the flowing drilling mud. The drilling tools are advanced into subterranean formations 102 to reach reservoir 104. Each well may target one or more reservoirs. The drilling tools are adapted for measuring downhole properties using logging while drilling tools. The logging while drilling tools may also be adapted for taking core sample 133 as shown.

Computer facilities may be positioned at various locations about the oilfield 100 (e.g., the surface unit 134) and/or at remote locations. Surface unit 134 may be used to communicate with the drilling tools and/or offsite operations, as well as with other surface or downhole sensors. Surface unit 134 is capable of communicating with the drilling tools to send commands to the drilling tools, and to receive data therefrom. Surface unit 134 may also collect data generated during the drilling operation and produce data output 135, which may then be stored or transmitted.

Sensors (S), such as gauges, may be positioned about oilfield 100 to collect data relating to various oilfield operations as described previously. As shown, sensor (S) is positioned in one or more locations in the drilling tools and/or at rig 128 to measure drilling parameters, such as weight on bit, torque on bit, pressures, temperatures, flow rates, compositions, rotary speed, and/or other parameters of the field operation. Sensors (S) may also be positioned in one or more locations in the circulating system.

Drilling tools 106.2 may include a bottom hole assembly (BHA) (not shown), generally referenced, near the drill bit (e.g., within several drill collar lengths from the drill bit). The bottom hole assembly includes capabilities for measuring, processing, and storing information, as well as communicating with surface unit 134. The bottom hole assembly further includes drill collars for performing various other measurement functions.

The bottom hole assembly may include a communication subassembly that communicates with surface unit 134. The communication subassembly is adapted to send signals to and receive signals from the surface using a communications channel such as mud pulse telemetry, electro-magnetic telemetry, or wired drill pipe communications. The communication subassembly may include, for example, a transmitter that generates a signal, such as an acoustic or electromagnetic signal, which is representative of the measured drilling parameters. It will be appreciated by one of skill in the art that a variety of telemetry systems may be employed, such as wired drill pipe, electromagnetic or other known telemetry systems.

Typically, the wellbore is drilled according to a drilling plan that is established prior to drilling. The drilling plan typically sets forth equipment, pressures, trajectories and/or other parameters that define the drilling process for the wellsite. The drilling operation may then be performed according to the drilling plan. However, as information is gathered, the drilling operation may need to deviate from the drilling plan. Additionally, as drilling or other operations are performed, the subsurface conditions may change. The earth model may also need adjustment as new information is collected The data gathered by sensors (S) may be collected by surface unit 134 and/or other data collection sources for analysis or other processing. The data collected by sensors (S) may be used alone or in combination with other data. The data may be collected in one or more databases and/or transmitted on or offsite. The data may be historical data, real time data, or combinations thereof. The real time data may be used in real time, or stored for later use. The data may also be combined with historical data or other inputs for further analysis. The data may be stored in separate databases, or combined into a single database.

Surface unit 134 may include transceiver 137 to allow communications between surface unit 134 and various portions of the oilfield 100 or other locations. Surface unit 134 may also be provided with or functionally connected to one or more controllers (not shown) for actuating mechanisms at oilfield 100. Surface unit 134 may then send command signals to oilfield 100 in response to data received. Surface unit 134 may receive commands via transceiver 137 or may itself execute commands to the controller. A processor may be provided to analyze the data (locally or remotely), make the decisions and/or actuate the controller. In this manner, oilfield 100 may be selectively adjusted based on the data collected. This technique may be used to optimize portions of the field operation, such as controlling drilling, weight on bit, pump rates, or other parameters. These adjustments may be made automatically based on computer protocol, and/or manually by an operator. In some cases, well plans may be adjusted to select optimum operating conditions, or to avoid problems.

FIG. 1.3 illustrates a wireline operation being performed by wireline tool 106.3 suspended by rig 128 and into wellbore 136 of FIG. 1.2. Wireline tool 106.3 is adapted for deployment into wellbore 136 for generating well logs, performing downhole tests and/or collecting samples. Wireline tool 106.3 may be used to provide another method and apparatus for performing a seismic survey operation. Wireline tool 106.3 may, for example, have an explosive, radioactive, electrical, or acoustic energy source 144 that sends and/or receives electrical signals to surrounding subterranean formations 102 and fluids therein.

Wireline tool 106.3 may be operatively connected to, for example, geophones 118 and a computer 122.1 of a seismic truck 106.1 of FIG. 1.1. Wireline tool 106.3 may also provide data to surface unit 134. Surface unit 134 may collect data generated during the wireline operation and may produce data output 135 that may be stored or transmitted. Wireline tool 106.3 may be positioned at various depths in the wellbore 136 to provide a survey or other information relating to the subterranean formation 102.

Sensors (S), such as gauges, may be positioned about oilfield 100 to collect data relating to various field operations as described previously. As shown, sensor S is positioned in wireline tool 106.3 to measure downhole parameters which relate to, for example porosity, permeability, fluid composition and/or other parameters of the field operation.

FIG. 1.4 illustrates a production operation being performed by production tool 106.4 deployed from a production unit or Christmas tree 129 and into completed wellbore 136 for drawing fluid from the downhole reservoirs into surface facilities 142. The fluid flows from reservoir 104 through perforations in the casing (not shown) and into production tool 106.4 in wellbore 136 and to surface facilities 142 via gathering network 146.

Sensors (S), such as gauges, may be positioned about oilfield 100 to collect data relating to various field operations as described previously. As shown, the sensor (S) may be positioned in production tool 106.4 or associated equipment, such as Christmas tree 129, gathering network 146, surface facility 142, and/or the production facility, to measure fluid parameters, such as fluid composition, flow rates, pressures, temperatures, and/or other parameters of the production operation.

Production may also include injection wells for added recovery. One or more gathering facilities may be operatively connected to one or more of the wellsites for selectively collecting downhole fluids from the wellsite(s).

While FIGS. 1.2-1.4 illustrate tools used to measure properties of an oilfield, it will be appreciated that the tools may be used in connection with non-oilfield operations, such as gas fields, mines, aquifers, storage, or other subterranean facilities. Also, while certain data acquisition tools are depicted, it will be appreciated that various measurement tools capable of sensing parameters, such as seismic two-way travel time, density, resistivity, production rate, etc., of the subterranean formation and/or its geological formations may be used. Various sensors (S) may be located at various positions along the wellbore and/or the monitoring tools to collect and/or monitor the desired data. Other sources of data may also be provided from offsite locations.

The field configurations of FIGS. 1.1-1.4 are intended to provide a brief description of an example of a field usable with oilfield application frameworks. Part, or all, of oilfield 100 may be on land, water, and/or sea. Also, while a single field measured at a single location is depicted, oilfield applications may be utilized with any combination of one or more oilfields, one or more processing facilities and one or more wellsites.

Figure 2:
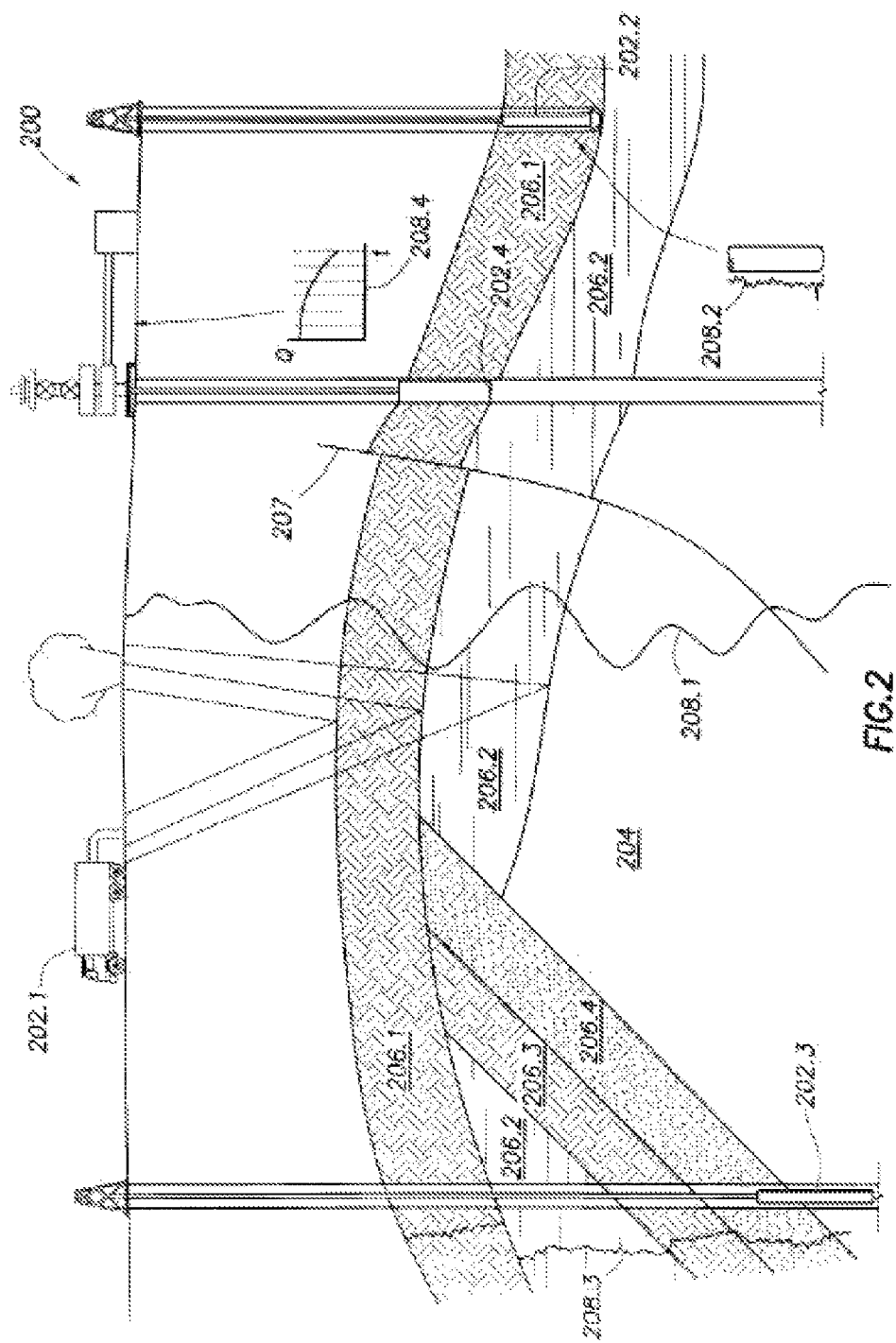
FIG. 2 illustrates a schematic view, partially in cross section of an oilfield having a plurality of data acquisition tools positioned at various locations along the oilfield for collecting data from the subterranean formations in accordance with implementations of various technologies and techniques described herein.

FIG. 2 illustrates a schematic view, partially in cross section of oilfield 200 having data acquisition tools 202.1, 202.2, 202.3 and 202.4 positioned at various locations along oilfield 200 for collecting data of subterranean formation 204 in accordance with implementations of various technologies and techniques described herein. Data acquisition tools 202.1-202.4 may be the same as data acquisition tools 106.1-106.4 of FIGS. 1.1-1.4, respectively, or others not depicted. As shown, data acquisition tools 202.1-202.4 generate data plots or measurements 208.1-208.4, respectively. These data plots are depicted along oilfield 200 to demonstrate the data generated by the various operations.

Data plots 208.1-208.3 are examples of static data plots that may be generated by data acquisition tools 202.1-202.3, respectively; however, it should be understood that data plots 208.1-208.3 may also be data plots that are updated in real time. These measurements may be analyzed to better define the properties of the formation(s) and/or determine the accuracy of the measurements and/or for checking for errors. The plots of each of the respective measurements may be aligned and scaled for comparison and verification of the properties.

Static data plot 208.1 is a seismic two-way response over a period of time. Static plot 208.2 is core sample data measured from a core sample of the formation 204. The core sample may be used to provide data, such as a graph of the density, porosity, permeability, or some other physical property of the core sample over the length of the core. Tests for density and viscosity may be performed on the fluids in the core at varying pressures and temperatures. Static data plot 208.3 is a logging trace that typically provides a resistivity or other measurement of the formation at various depths.

A production decline curve or graph 208.4 is a dynamic data plot of the fluid flow rate over time. The production decline curve typically provides the production rate as a function of time. As the fluid flows through the wellbore, measurements are taken of fluid properties, such as flow rates, pressures, composition, etc.

Other data may also be collected, such as historical data, user inputs, economic information, and/or other measurement data and other parameters of interest. As described below, the static and dynamic measurements may be analyzed and used to generate models of the subterranean formation to determine characteristics thereof. Similar measurements may also be used to measure changes in formation aspects over time.

The subterranean structure 204 has a plurality of geological formations 206.1-206.4. As shown, this structure has several formations or layers, including a shale layer 206.1, a carbonate layer 206.2, a shale layer 206.3 and a sand layer 206.4. A fault 207 extends through the shale layer 206.1 and the carbonate layer 206.2. The static data acquisition tools are adapted to take measurements and detect characteristics of the formations.

While a specific subterranean formation with specific geological structures is depicted, it will be appreciated that oilfield 200 may contain a variety of geological structures and/or formations, sometimes having extreme complexity. In some locations, typically below the water line, fluid may occupy pore spaces of the formations. Each of the measurement devices may be used to measure properties of the formations and/or its geological features. While each acquisition tool is shown as being in specific locations in oilfield 200, it will be appreciated that one or more types of measurement may be taken at one or more locations across one or more fields or other locations for comparison and/or analysis.

The data collected from various sources, such as the data acquisition tools of FIG. 2, may then be processed and/or evaluated. Typically, seismic data displayed in static data plot 208.1 from data acquisition tool 202.1 is used by a geophysicist to determine characteristics of the subterranean formations and features. The core data shown in static plot 208.2 and/or log data from well log 208.3 are typically used by a geologist to determine various characteristics of the subterranean formation. The production data from graph 208.4 is typically used by the reservoir engineer to determine fluid flow reservoir characteristics. The data analyzed by the geologist, geophysicist and the reservoir engineer may be analyzed using modeling techniques.

Figure 3:
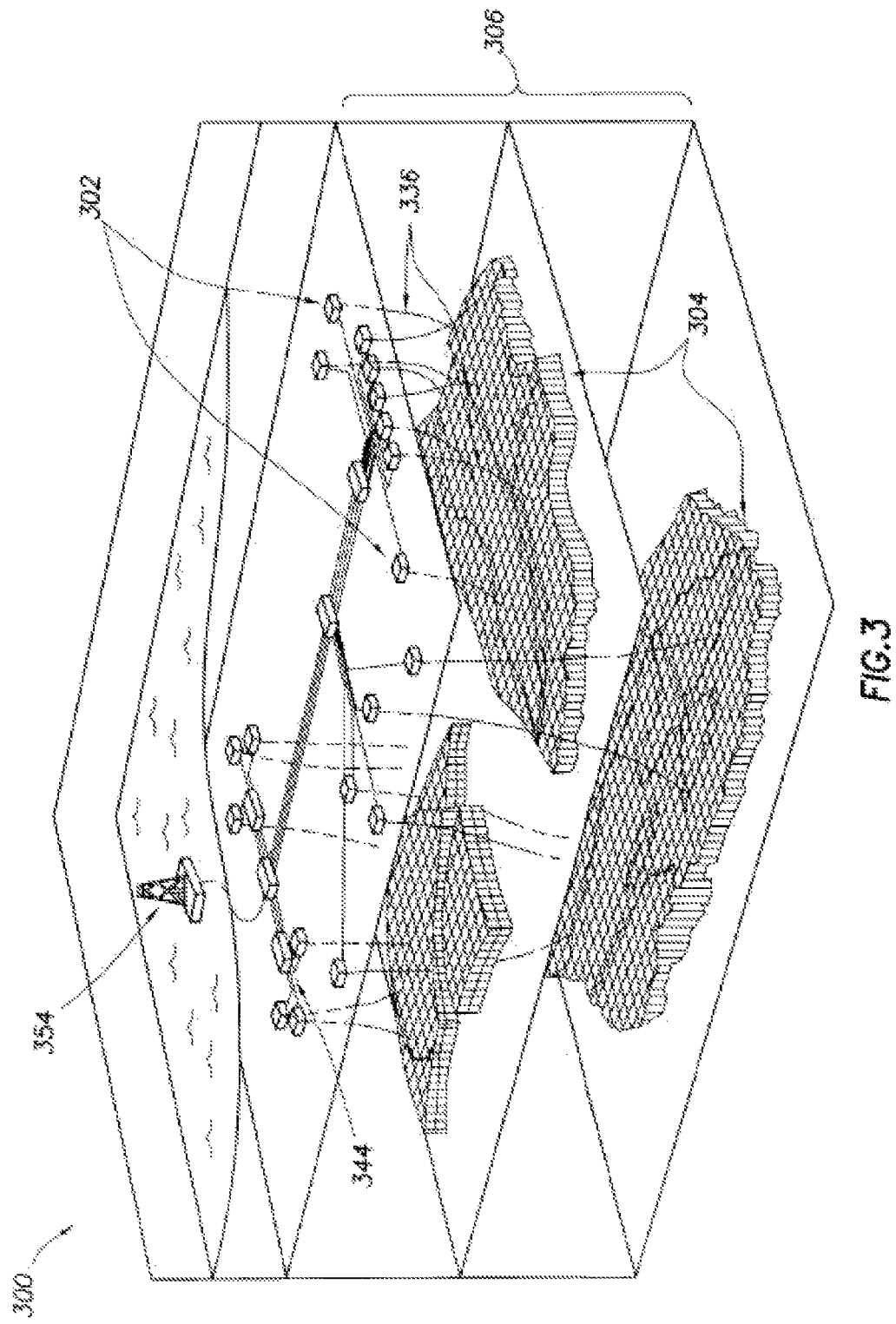
FIG. 3 illustrates a production system for performing one or more oilfield operations in accordance with implementations of various technologies and techniques described herein.

FIG. 3 illustrates an oilfield 300 for performing production operations in accordance with implementations of various technologies and techniques described herein. As shown, the oilfield has a plurality of wellsites 302 operatively connected to central processing facility 354. The oilfield configuration of FIG. 3 is not intended to limit the scope of the oilfield application system. Part or all of the oilfield may be on land and/or sea. Also, while a single oilfield with a single processing facility and a plurality of wellsites is depicted, any combination of one or more oilfields, one or more processing facilities and one or more wellsites may be present.

Each wellsite 302 has equipment that forms wellbore 336 into the earth. The wellbores extend through subterranean formations 306 including reservoirs 304. These reservoirs 304 contain fluids, such as hydrocarbons. The wellsites draw fluid from the reservoirs and pass them to the processing facilities via surface networks 344. The surface networks 344 have tubing and control mechanisms for controlling the flow of fluids from the wellsite to processing facility 354.

Modeling Hydraulic Fractures in a Well

Figure 4:
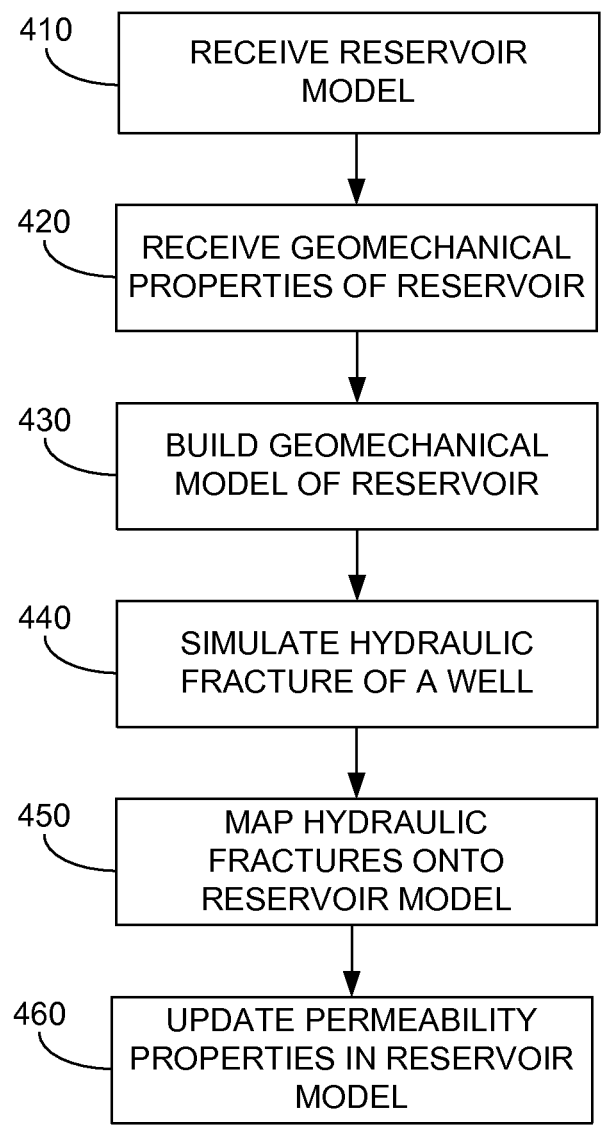
FIG. 4 illustrates a flow diagram of a method for modeling hydraulic fractures in a well in accordance with implementations of various technologies and techniques described herein.
Figure 5A:
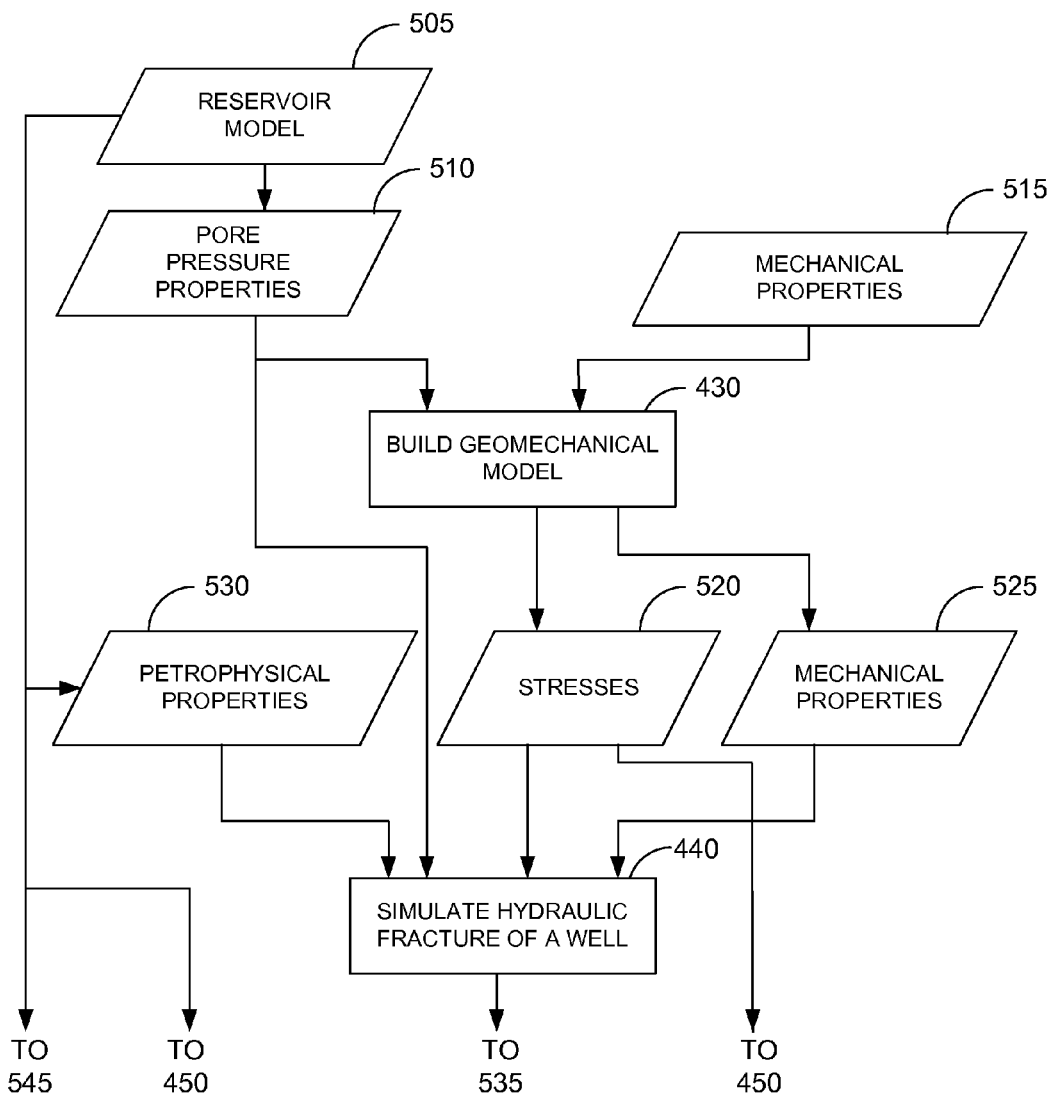
FIGS. 5A-5B illustrate a data flow diagram of a method for modeling hydraulic fractures of a well in accordance with implementations of various technologies and techniques described herein.
Figure 5B:
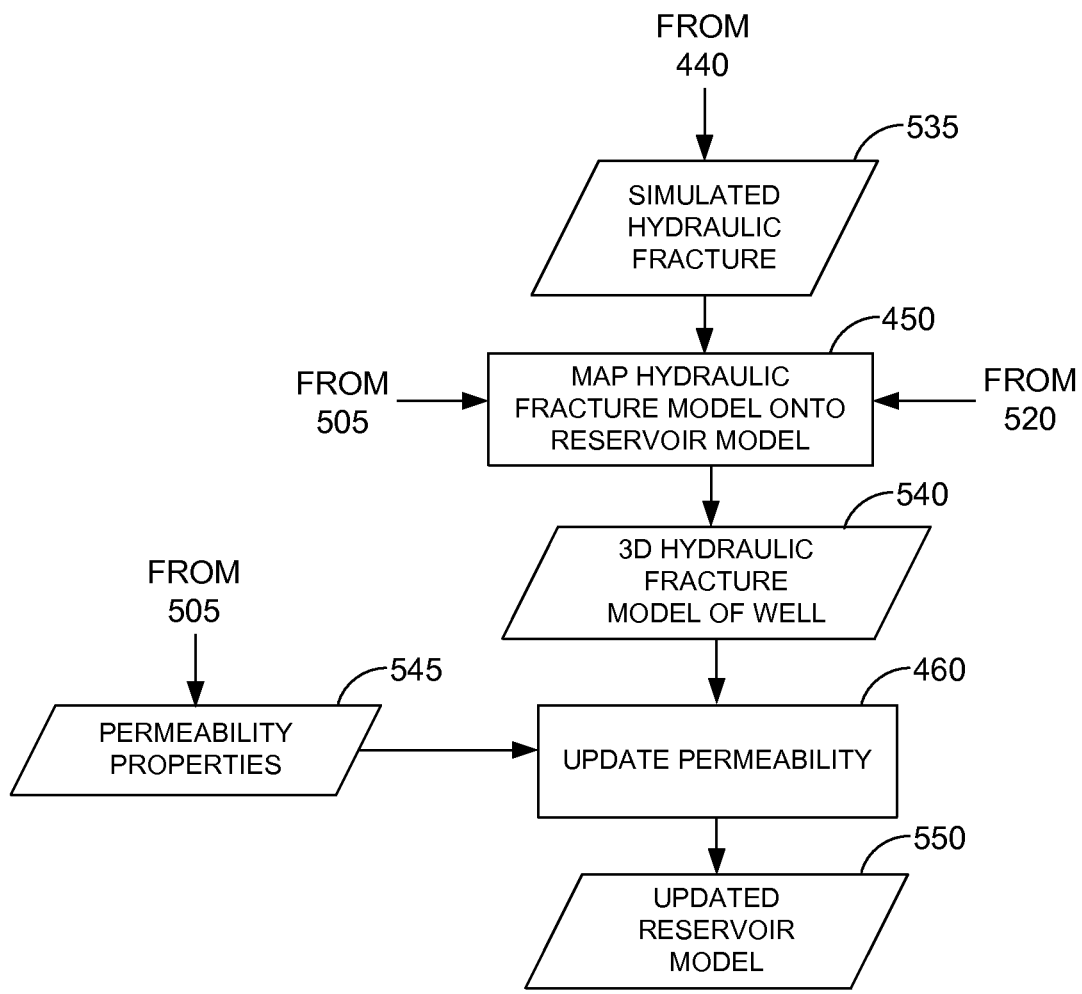

FIG. 4 illustrates a flow diagram of a method for modeling hydraulic fractures in a well in accordance with implementations of various technologies and techniques described herein. In one implementation, method 400 may be performed by a computer application. It should be understood that while method 400 indicates a particular order of execution of the operations, in some implementations, certain portions of the operations might be executed in a different order. The following description of method 400 is provided with reference to data flow diagram 500 of FIGS. 5A-5B.

At step 410, the computer application may receive reservoir model 505. Reservoir model 505 may describe the flow of fluids in the reservoir. Reservoir model 505 may also indicate various petrophysical properties of the subsurface of the earth near the reservoir. In one implementation, the petrophysical properties 530 may include pore pressure properties 510 in the subsurface of the earth and permeability properties along the trajectory of a well in the reservoir. Pore pressure properties 510 may include pore pressure changes along a well in the reservoir.

At step 420, the computer application may receive mechanical properties 515 of the reservoir. Mechanical properties 515 describe mechanical properties of the subsurface of the earth. For instance, mechanical properties 515 may include faults, fractures and mechanical properties of the rock mass in which the reservoir resides.

At step 430, the computer application may build a geomechanical model of the reservoir based on reservoir model 505 and mechanical properties 515. In one implementation, the geomechanical model may incorporate pore pressure properties 510 such as pore pressure changes together with mechanical properties 515. Pore pressure properties 510 may include pore pressure loading. In one implementation, in addition to pore pressure properties 510, gravity loading and tectonics loading may be used to calculate a 3D stress state over the geomechanical model of the reservoir.

In one implementation, the computer application may use pore pressure loading, gravity loading and tectonics loading elements to globally solve a set of three dimensional equilibrium equations. As a result, the computer application may account for the effects of faults/fractures in the calculation of the stresses, the lateral contrasts between mechanical properties 515 and the interaction between the earth layers.

In one implementation, pore pressure changes (i.e., pore pressure properties 510) in reservoir model 505 may be used to calculate corresponding stress fields in the geomechanical model of the reservoir. As a result, the geomechanical model of the reservoir may include stress fields near the well, elastic mechanical properties of the earth near the well, pore pressure properties along the trajectory of the well, the porosity and impact flow permeability properties along the trajectory of the well and the saturation properties (water, gas and oil saturations) of the subsurface of the earth near the well. In one implementation, the geomechanical model of the reservoir may be represented as a three dimensional model or map of the stress tensors or principal stresses of the subsurface of the earth (e.g., stresses 520).

After generating the geomechanical model of the reservoir, the computer application may import the geomechanical model into a seismic-to-simulation software to generate petrophysical and geomechanical parameter logs. The petrophysical and geomechanical logs may include stress contrast zones that may be used to more efficiently simulate hydraulic fractures in a simulator.

At step 440, the computer application may simulate a hydraulic fracture of the well based on the geomechanical model of the reservoir and the reservoir model. In one implementation, inputs for the simulation of the hydraulic fracture may include stresses 520 (e.g., the 3D stress map from the geomechanical model of the reservoir), mechanical properties 525 from the geomechanical model of the reservoir, pore pressure properties 510 from reservoir model 505, and petrophysical properties 530 from reservoir model 505. Petrophysical properties 530 may include properties of the reservoir such as clay volume, total porosity, effective porosity, water saturation, permeability and the like. Simulated hydraulic fracture 535 may indicate the fracture geometry such as variations in height, width and length of the fracture. Additionally, simulated hydraulic fracture 535 may also indicate the permeability profile along a one-dimensional or two-dimensional planar fracture.

By using the geomechanical model of the reservoir and the reservoir model to simulate the hydraulic fracture of the well, the computer application may be able to enhance the understanding of the effects of the stress state on hydraulic fracture stimulations, thereby simulating more accurate hydraulic fracture paths or propagation directions.

At step 450, the computer application may map simulated hydraulic fractures 535 onto reservoir model 505 using stresses 520 to generate a three dimensional representation of the hydraulic fracture 540 for a stimulated well. In one implementation, the computer application may generate the three dimensional representation of the hydraulic fracture 540 by building a three dimensional volume of the hydraulic fracture using the geometry information as indicated in simulated hydraulic fractures 535. The computer application may build the three dimensional volume starting from the well location for each grid cell in reservoir model 505 on a cell-by-cell basis using the stress directions, as indicated in stresses 520, as a guide to determine the hydraulic fracture path. Although simulated hydraulic fractures 535 may be planar features, by using a three dimensional stress field as indicated in stresses 520 as a guide, the computer application may generate non-symmetrical hydraulic fracture propagations away from the well in order to build the three dimensional volume of the hydraulic fracture.

In one implementation, the computer application may use the three dimensional representation of the hydraulic fracture 540 to create a hydraulic fracture design for the reservoir. Data regarding the hydraulic fractures in the wellbore may then be gathered and used to recalibrate simulated hydraulic fractures 535. The recalibration process may be used to reduce uncertainties in mechanical properties 525, petrophysical properties 530 and simulated hydraulic fractures 535. In one implementation, the recalibration process may be repeated until the discrepancy between a first set of recalibrated data and a subsequent set of recalibrated data is less than a predetermined value.

At step 460, the computer application may update the permeability properties of each grid cell in the reservoir model that has been intersected by the three dimensional representation of the hydraulic fracture 540. In one implementation, the computer application may use the permeability properties 545 from reservoir model 505 as the initial permeability properties in the reservoir model. The computer application may update the initial permeability properties 545 of reservoir model 505 based on the three dimensional representation of the hydraulic fracture 540. In one implementation, the permeability update may be done using tracking software that ensures that the hydraulic fracture direction on a cell-by-cell basis in the reservoir model 505 follows the direction of the maximum principal horizontal stress.

In one implementation, the computer application may then use the updated permeability properties to generate an updated reservoir model 550 having the updated permeability properties. In another implementation, the computer application may determine production forecasts for the stimulated well based on the updated permeability properties.

Although method 400 has been described as being used to determine updated permeability properties and production forecasts, it should be noted that method 400 is not limited to being used for these tasks. For instance, method 400 may also be used to determine an optimum stimulation design, thus allowing for an enhanced prediction of reservoir performance, and enhanced predictions of projected revenue.

Advantages

Method 400 creates a 3D representation of the hydraulic fractures. In contrast, traditional methods for simulating hydraulic fractures use the principal stresses in the pay zone, such as a minimum principal horizontal stress, as an input in its simulator. The minimum principal horizontal stress may be calculated using a one-dimensional mechanical earth model (MEM). In this manner, the traditional method for simulating hydraulic fractures use a one dimensional mechanical earth model for doing rock mechanics calculations and simulations. The benefits of the three dimensional representation become apparent when opening up new areas of predictive modeling such as the prediction of changes in stress magnitudes and directions caused by production. As a result, the predicted stress magnitudes and directions can be used to guide the design of better stimulation treatments.

Computer System

Figure 6:
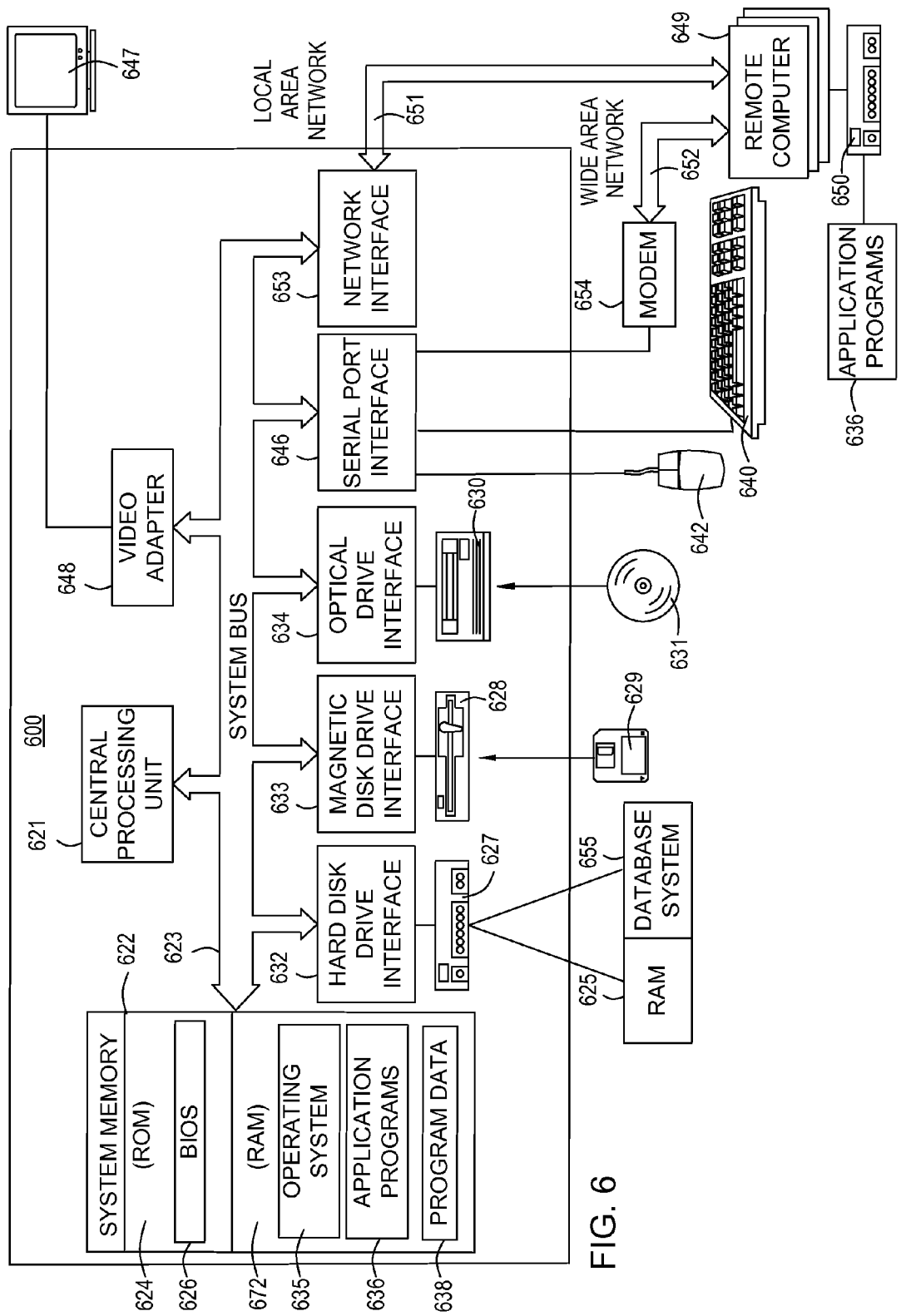
FIG. 6 illustrates a computer system into which implementations of various technologies and techniques described herein.

FIG. 6 illustrates a computer system 600 into which implementations of various technologies and techniques described herein may be implemented. In one implementation, computing system 600 may be a conventional desktop or a server computer, but it should be noted that other computer system configurations may be used.

The computing system 600 may include a central processing unit (CPU) 621, a system memory 622 and a system bus 623 that couples various system components including the system memory 622 to the CPU 621. Although only one CPU is illustrated in FIG. 6, it should be understood that in some implementations the computing system 600 may include more than one CPU. The system bus 623 may be any of several types of bus structures, including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus. The system memory 622 may include a read only memory (ROM) 624 and a random access memory (RAM) 625. A basic input/output system (BIOS) 626, containing the basic routines that help transfer information between elements within the computing system 600, such as during start-up, may be stored in the ROM 624.

The computing system 600 may further include a hard disk drive 627 for reading from and writing to a hard disk, a magnetic disk drive 628 for reading from and writing to a removable magnetic disk 629, and an optical disk drive 630 for reading from and writing to a removable optical disk 631, such as a CD ROM or other optical media. The hard disk drive 627, the magnetic disk drive 628, and the optical disk drive 630 may be connected to the system bus 623 by a hard disk drive interface 632, a magnetic disk drive interface 633, and an optical drive interface 634, respectively. The drives and their associated computer-readable media may provide nonvolatile storage of computer-readable instructions, data structures, program modules and other data for the computing system 600.

Although the computing system 600 is described herein as having a hard disk, a removable magnetic disk 629 and a removable optical disk 631, it should be appreciated by those skilled in the art that the computing system 600 may also include other types of computer-readable media that may be accessed by a computer. For example, such computer-readable media may include computer storage media and communication media. Computer storage media may include volatile and non-volatile, and removable and non-removable media implemented in any method or technology for storage of information, such as computer-readable instructions, data structures, program modules or other data. Computer storage media may further include RAM, ROM, erasable programmable read-only memory (EPROM), electrically erasable programmable read-only memory (EEPROM), flash memory or other solid state memory technology, CD-ROM, digital versatile disks (DVD), or other optical storage, magnetic cassettes, magnetic tape, magnetic disk storage or other magnetic storage devices, or any other medium which can be used to store the desired information and which can be accessed by the computing system 600. Communication media may embody computer readable instructions, data structures, program modules or other data in a modulated data signal, such as a carrier wave or other transport mechanism and may include any information delivery media. By way of example, and not limitation, communication media may include wired media such as a wired network or direct-wired connection, and wireless media such as acoustic, RF, infrared and other wireless media. Combinations of any of the above may also be included within the scope of computer readable media.

A number of program modules may be stored on the hard disk 627, magnetic disk 629, optical disk 631, ROM 624 or RAM 625, including an operating system 635, one or more application programs 636, program data 638, and a database system 655. The operating system 635 may be any suitable operating system that may control the operation of a networked personal or server computer, such as Windows® XP, Mac OS® X, Unix-variants (e.g., Linux® and BSD®), and the like. In one implementation, the computer application described with reference to FIG. 4 in the paragraphs above may be stored as application programs 636.

A user may enter commands and information into the computing system 600 through input devices such as a keyboard 640 and pointing device 642. Other input devices may include a microphone, joystick, game pad, satellite dish, scanner, or the like. These and other input devices may be connected to the CPU 621 through a serial port interface 646 coupled to system bus 623, but may be connected by other interfaces, such as a parallel port, game port or a universal serial bus (USB). A monitor 647 or other type of display device may also be connected to system bus 623 via an interface, such as a video adapter 648. In addition to the monitor 647, the computing system 600 may further include other peripheral output devices such as speakers and printers.

Further, the computing system 600 may operate in a networked environment using logical connections to one or more remote computers 649. The logical connections may be any connection that is commonplace in offices, enterprise-wide computer networks, intranets, and the Internet, such as local area network (LAN) 651 and a wide area network (WAN) 652. The remote computers 649 may each include application programs 636 similar to that as described above. In one implementation, the plug-in quality application (i.e., performing method 500) stored in plug-in quality center 460 may be stored as application programs 636 in system memory 622.

When using a LAN networking environment, the computing system 600 may be connected to the local network 651 through a network interface or adapter 653. When used in a WAN networking environment, the computing system 600 may include a modem 654, wireless router or other means for establishing communication over a wide area network 652, such as the Internet. The modem 654, which may be internal or external, may be connected to the system bus 623 via the serial port interface 646. In a networked environment, program modules depicted relative to the computing system 600, or portions thereof, may be stored in a remote memory storage device 650. It will be appreciated that the network connections shown are exemplary and other means of establishing a communications link between the computers may be used.

It should be understood that the various technologies described herein may be implemented in connection with hardware, software or a combination of both. Thus, various technologies, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the various technologies. In the case of program code execution on programmable computers, the computing device may include a processor, a storage medium readable by the processor (including volatile and non-volatile memory and/or storage elements), at least one input device, and at least one output device. One or more programs that may implement or utilize the various technologies described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the foregoing is directed to implementations of various technologies described herein, other and further implementations may be devised without departing from the basic scope thereof, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for modeling one or more hydraulic fractures of a well in a reservoir, comprising:
    receiving a reservoir model having one or more petrophysical properties of a subsurface of the earth near the reservoir;
    receiving one or more mechanical properties of the reservoir;
    generating, using a processor, a geomechanical model of the reservoir based on the reservoir model and the mechanical properties;
    simulating, using the processor, the hydraulic fractures using the geomechanical model and the reservoir model; and
    mapping, using the processor, the simulated hydraulic fractures onto the reservoir model, thereby generating a three dimensional (3D) representation of the hydraulic fractures.

2. The method of claim 1, wherein the petrophysical properties comprise one or more pore pressure properties in the subsurface of the earth, one or more permeability properties along a trajectory of the well, or combinations thereof.

3. The method of claim 1, wherein the petrophysical properties comprise one or more pore pressure changes along the well.

4. The method of claim 1, wherein the mechanical properties comprise one or more faults in the reservoir, one or more fractures in the reservoir, one or more pore pressure cubes in the reservoir, one or more mechanical properties of a rock mass in which the reservoir resides, or combinations thereof.

5. The method of claim 1, wherein the geomechanical model incorporates one or more pore pressure changes from the reservoir model with the mechanical properties.

6. The method of claim 1, wherein generating the geomechanical model of the reservoir comprises:
    calculating a three-dimensional (3D) stress state over the geomechanical model.

7. The method of claim 6, wherein the 3D stress state is calculated based on pore pressure loading, gravity loading, tectonics loading or combinations thereof.

8. The method of claim 1, further comprising calculating one or more stress fields in the geomechanical model based on one or more pore pressure changes from the reservoir model and a set of three dimensional equilibrium equations.

9. The method of claim 1, wherein the geomechanical model comprises one or more stress fields near the well, one or more elastic mechanical properties of the earth near the well, one or more pore pressure properties along the trajectory of the well, one or more porosity and impact flow permeability properties along the trajectory of the well, one or more saturation properties of the subsurface of the earth near the well, or combinations thereof.

10. The method of claim 1, wherein the geomechanical model is a three dimensional model of one or more stress tensors of the subsurface of the earth.

11. The method of claim 1, wherein the hydraulic fractures indicate one or more variations in height, width, length or combinations thereof of one or more fractures in the well.

12. The method of claim 1, wherein generating the 3D representation of the hydraulic fractures comprises building a three dimensional volume of the hydraulic fractures starting from the well for each grid cell in the reservoir model on a cell-by-cell basis using one or more stress directions found in the geomechanical model as a guide to determine one or more paths of the hydraulic fractures.

13. The method of claim 1, wherein the hydraulic fractures are simulated using one or more stresses from the geomechanical model, mechanical properties from the geomechanical model, one or more pore pressure properties from the reservoir model, the petrophysical properties, or combinations thereof.

14. The method of claim 1, further comprising updating one or more permeability properties of one or more grid cells in the reservoir model that has been intersected by the 3D representation of the hydraulic fractures.

15. The method of claim 14, wherein the permeability properties are updated based on the direction of a maximum principal horizontal stress.

16. The method of claim 14, further comprising generating an updated reservoir model based on the updated permeability properties.

17. The method of claim 14, further comprising generating one or more production forecasts for the well based on the updated permeability properties.

18. A non-transitory computer-readable medium having stored thereon computer-executable instructions which, when executed by a computer, cause the computer to:
receive a reservoir model having one or more petrophysical properties of a subsurface of the earth near the reservoir;
receive one or more mechanical properties of the reservoir;
generate a geomechanical model of the reservoir based on the reservoir model and the mechanical properties;
simulate hydraulic fractures using the geomechanical model and the reservoir model; and
map the simulated hydraulic fractures onto the reservoir model, thereby generating a three dimensional (3D) representation of the hydraulic fractures.

19. The non-transitory computer-readable medium of claim 18, wherein the computer-executable instructions that cause the computer to generate the 3D representation of the hydraulic fractures comprises computer-executable instructions that cause the computer build a three dimensional volume of the hydraulic fractures starting from a well for each grid cell in the reservoir model on a cell-by-cell basis using one or more stress directions found in the geomechanical model as a guide to determine one or more paths of the hydraulic fractures.

20. A computer system, comprising:
a processor; and
a memory comprising program instructions executable by the processor to:
receive a reservoir model having one or more petrophysical properties of a subsurface of the earth near the reservoir;
receive one or more mechanical properties of the reservoir;
generate a geomechanical model of the reservoir based on the reservoir model and the mechanical properties;
simulate hydraulic fractures using the geomechanical model and the reservoir model; and
map the simulated hydraulic fractures onto the reservoir model, thereby generating a three dimensional (3D) representation of the hydraulic fractures.

21. The computer system of claim 20, wherein the program instructions executable by the processor to generate the 3D representation of the hydraulic fractures further comprises program instructions executable by the processor to
build a three dimensional volume of the hydraulic fractures starting from a well for each grid cell in the reservoir model on a cell-by-cell basis using one or more stress directions found in the geomechanical model as a guide to determine one or more paths of the hydraulic fractures.

* * * * *